US006204720B1

(12) United States Patent
Gray

(10) Patent No.: US 6,204,720 B1
(45) Date of Patent: Mar. 20, 2001

(54) LOAD CURRENT CONTROL CIRCUITRY FOR POWER SUPPLIES DRIVING A COMMON LOAD FOR PROVIDING A UNIFORM TEMPERATURE DISTRIBUTION

(75) Inventor: Richard L. Gray, Saratoga, CA (US)

(73) Assignee: Elantec Semiconductor, Inc., Milpitas, CA (US)

( * ) Notice: Subject to any disclaimer, the term of this patent is extended or adjusted under 35 U.S.C. 154(b) by 0 days.

(21) Appl. No.: 09/169,512

(22) Filed: Oct. 9, 1998

(51) Int. Cl.$^{7}$ .................................................... H01L 35/00

(52) U.S. Cl. .......................... 327/513; 327/378; 327/538; 323/907

(58) Field of Search .................................... 327/530, 538, 327/378, 512, 513, 540, 541; 326/32, 31; 323/907

(56) References Cited

U.S. PATENT DOCUMENTS 5,939,872 * 8/1999 Dubos et al. ........................ 323/367
5,973,542 * 10/1999 Okayasu et al. ..................... 327/378

* cited by examiner

*Primary Examiner*—Timothy P. Callahan
*Assistant Examiner*—Minh Nguyen
(74) *Attorney, Agent, or Firm*—Fliesler, Dubb, Meyer & Lovejoy LLP

(57) ABSTRACT

Control circuitry is used to provide a uniform temperature distribution between multiple power supplies on a chip which drive a single load. The power supplies each include a MOSFET with a source to drain path connecting $V_{DD}$ to the single load. The control circuitry includes a bipolar diode placed close to the MOSFET in each power supply unit, each diode providing a voltage varying inversely proportional to temperature changes resulting from power dissipated by its respective MOSFET. The control circuitry further includes components in each power supply unit to provide the voltage from the bipolar diode with the lowest voltage (or highest temperature) on a bus external to the power supply units. The bus voltage is then examined in the control circuitry in each of the power supply units and if the bipolar diode voltage in a unit is equal to the bus voltage, that unit does not increase current from its respective MOSFET to the load since it has the highest temperature. Other power supply units which have a diode voltage greater than the bus voltage will increase current supplied from their respective MOSFETs to the load. Lower temperature units will then heat up and higher temperature units will cool down until an equilibrium is reached.

4 Claims, 2 Drawing Sheets

LOAD CURRENT CONTROL CIRCUITRY FOR POWER SUPPLIES DRIVING A COMMON LOAD FOR PROVIDING A UNIFORM TEMPERATURE DISTRIBUTION

BACKGROUND OF THE INVENTION

1. Field of the Invention

This invention relates to a circuit for controlling load current from multiple power supplies connected to drive a single load.

2. Description of the Related Art

FIG. 1 shows a block diagram of a power supply circuit wherein multiple power supply units $\mathbf{100}_1$–$\mathbf{100}_N$ drive a common load 102. The power supply units $\mathbf{100}_1$–$\mathbf{100}_N$ may each include a power metal oxide semiconductor field effect transistor (MOSFET) having a source to drain connecting $V_{DD}$ to the load 102. As an alternative to MOSFETS, the power supply units $\mathbf{100}_1$–$\mathbf{100}_N$ may also include some other suitable power or switching elements. Current provided to the load 102 in each of the power supply units $\mathbf{100}_1$–$\mathbf{100}_N$ is controlled using a voltage bias circuit driving the gate of each of the power MOSFET transistors in the power supply units $\mathbf{100}_1$–$\mathbf{100}_N$. Typically, the bias circuitry is controlled so that the load current is equally shared between the MOSFETs of the power supply units $\mathbf{100}_1$–$\mathbf{100}_N$.

By equally distributing the load current between the power MOSFETs of the power supply units $\mathbf{100}_1$–$\mathbf{100}_N$, the difficulty a particular unit may have in achieving a desired current level is not taken into account. For example, suppose two power supply units share a 10 amp load. A typical current sharing scheme would force each power supply unit to provide 5 amps of load current. Now assume that a MOSFET in a first power supply unit has a drain to source resistance (Rds) that is 25% higher than the second power supply unit. The power dissipated by the first power supply unit would then be 25% higher than power dissipated by the second unit. The first unit could then run significantly hotter than the second unit, potentially causing reliability problems.

SUMMARY OF THE INVENTION

The present invention allows multiple power supply units to drive a single load with each power supply unit contributing equally from the perspective of power dissipation so that a uniform temperature can be achieved among all power supply units.

The present invention senses power dissipated in each power supply unit by measuring the temperature of the integrated circuit power supply unit, and then controls the current provided from each power supply unit to equalize the temperatures.

The present invention includes current control circuitry with a first bipolar diode placed in close thermal proximity to the MOSFET in each power supply unit. By being placed in close thermal proximity to a MOSFET, each first diode provides a voltage varying inversely proportional to temperature changes caused by power dissipated from the respective MOSFET.

The control circuitry further includes a second diode and amplifier provided in each power supply unit to apply the voltage from the first diode with the lowest voltage (or highest temperature) on a bus external to the power supply units. The amplifier and second diode of each power supply unit then function so that if the voltage across the first diode in a unit is equal to the bus voltage, the bias voltage applied to the gate of the MOSFET in that unit is not increased since it has the highest temperature. However, if the unit has a first diode voltage greater than the bus voltage, bias voltage applied to the gate of the MOSFET in the unit is increased so that the unit supplies a greater share of the load current. Lower temperature units will then heat up and higher temperature units will cool down until an equilibrium is reached.

BRIEF DESCRIPTION OF THE DRAWINGS

Further details of the present invention are explained with the help of the attached drawings in which.

DETAILED DESCRIPTION

Figure 1:
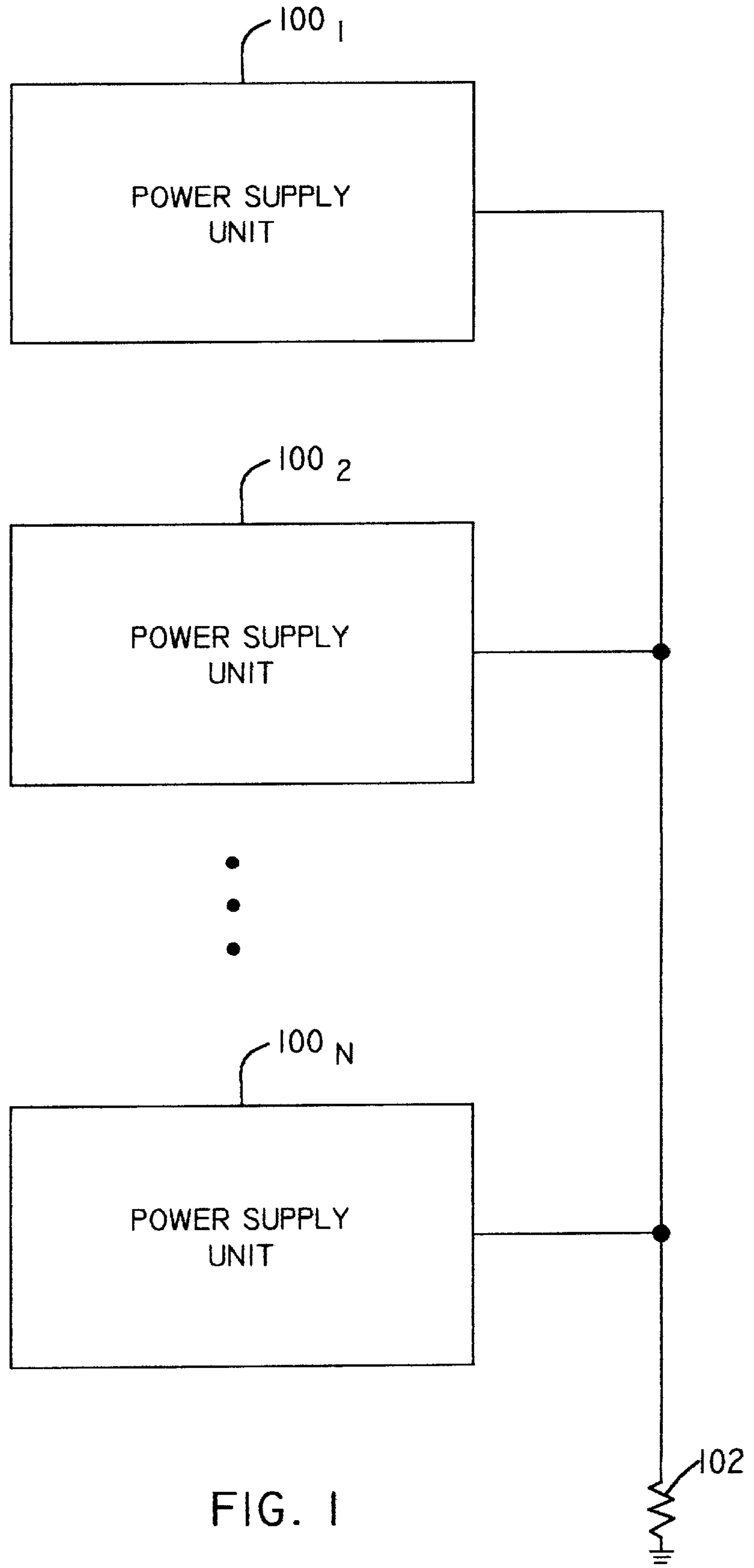
FIG. 1 is a block diagram of power supply units driving a single load.
Figure 2:
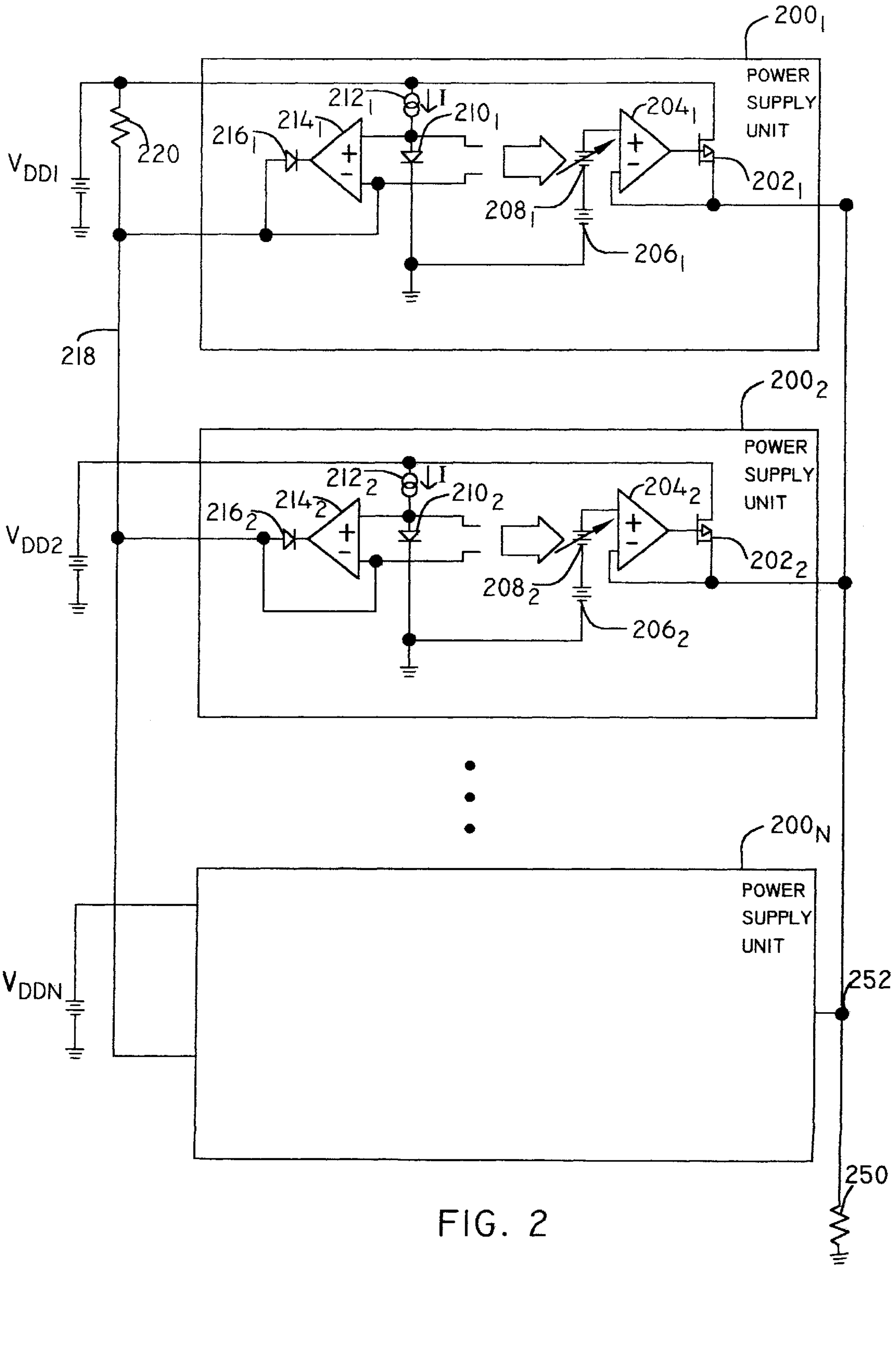
FIG. 2 shows multiple power supply units driving a single load along with control circuitry of the present invention to provide a uniform temperature distribution between the power supply units.

FIG. 2 shows multiple linear power supply units $\mathbf{200}_1$–$\mathbf{200}_N$ connected in parallel to drive a single load 250. The power supply units $\mathbf{200}_1$–$\mathbf{200}_N$ include control circuitry of the present invention to provide a uniform temperature distribution. Detailed circuitry is shown in FIG. 2 for the power supplies $\mathbf{200}_1$ and $\mathbf{200}_2$. Although circuitry for linear power supply units are shown, the present invention as described in detail below is likewise applicable to other power supply schemes, such as switching power supplies or power elements other than MOSFETs.

As with prior art power supply units, each of the units $\mathbf{200}_1$–$\mathbf{200}_N$ includes a respective power MOSFET $\mathbf{202}_1$–$\mathbf{202}_N$ each having a source to drain path connecting one of power supplies $V_{DD1-VDDN}$ to the load 250. Although the power supplies $V_{DD1}$–$V_{DDN}$ are shown as separate devices, a single power supply may likewise be used with the source to drain of each of the power MOSFETs $\mathbf{202}_1$–$\mathbf{202}_N$ connecting the single power supply to the load 250.

The MOSFETS $\mathbf{202}_1$–$\mathbf{202}_N$ are each connected with a respective amplifier $\mathbf{204}_1$–$\mathbf{204}_N$ to form primary regulating or biasing loops in each power supply. The output voltage at the load terminal 252 is sensed at the inverting input of each of the amplifiers $\mathbf{204}_1$–$\mathbf{204}_N$ in the loops and compared to the series combination of respective voltage sources $\mathbf{206}_1$–$\mathbf{206}_N$ and $\mathbf{208}_1$–$\mathbf{208}_N$ as sensed at a noninverting terminal of the amplifier. If the voltage at the load terminal 252 drops below the voltage applied to the noninverting input of one of the amplifiers $\mathbf{204}_1$–$\mathbf{204}_N$, the amplifier will turn on to increase the voltage on the gate of the MOSFET connected to its output, resulting in increased current provided from the respective MOSFET. The voltage sources $\mathbf{206}_1$–$\mathbf{206}_N$ are fixed voltage references all with the same voltage for each of the power supply units, while the voltage sources $\mathbf{208}_1$–$\mathbf{208}_N$ are adjustable voltage sources receiving a control voltage and supplying a voltage much less than any of the voltage sources $\mathbf{206}_1$–$\mathbf{206}_N$.

The control circuitry of the present invention for biasing the gate of the MOSFETs $\mathbf{202}_1$–$\mathbf{202}_N$ in each of the power supply units includes a respective bipolar diode $\mathbf{210}_1$–$\mathbf{210}_N$. Each diode $\mathbf{210}_1$–$\mathbf{210}_N$ is a temperature sensing diode placed in close thermal proximity to a corresponding MOSFET $\mathbf{202}_1$–$\mathbf{202}_N$ in the power supply units. As current increases through each MOSFET, so does temperature, so the voltage across a corresponding diode $\mathbf{210}_1$–$\mathbf{210}_N$ should drop inversely proportional to temperature by the well known approximation of −2 mV per degree Celsius of temperature rise. The temperature of the chip in the vicinity of each MOSFET can then be represented by voltage across one of the diodes $210_1$–$210_N$ with a known current flowing through the diode.

A known current is provided to the diodes $210_1$–$210_N$ with respective current sources $212_1$–$212_N$. The current sources $212_1$–$212_N$ each connect a respective one of the power supplies $V_{DD1}$–$V_{DDN}$ to one of the diodes $210_1$–$210_N$. The current sources $212_1$–$212_N$ can each be provided by a transistor having a gate connected to a voltage reference. With the diodes $210_1$–$210_N$ being p-n type bipolar diodes, the current source will be connected to the p terminal, while the n terminal will be connected to $V_{SS}$.

The power supply units each further include a respective amplifier $214_1$–$214_N$ and second diode $216_1$–$216_N$. The second diodes $216_1$–$216_N$ each have a p-n type junction with a p terminal connected to the inverting input of a respective amplifier $214_1$–$214_N$ and an n terminal connected to the output of the respective amplifier $214_1$–$214_N$. The voltage difference from the inverting to the noninverting input of the amplifiers $214_1$–$214_N$ is applied to the control input of a voltage source $208_1$–$208_N$ in each of the power supply units.

The inverting input of the amplifiers $214_1$–$214_N$ are connected together to form a bus 218. The bus 218 is connected by a resistor 220 to the power supply $V_{DD1}$ for the power supply unit $202_1$.

In operation, the respective amplifiers $214_1$–$214_N$ and second diodes $216_1$–$216_N$ of each power supply unit function to force the voltage from the one of the bipolar diodes $210_1$–$210_N$ which has the lowest voltage onto the bus 218. Such a function is provided since the noninverting input of the amplifier $214_1$–$214_N$ with the lowest bipolar diode voltage will be lower than its inverting input voltage and its output will forward bias a respective diode $216_1$–$216_N$ to charge the bus 218 so that its noninverting and inverting inputs will be equal. The bipolar diodes $210_1$–$210_N$ which do not have the lowest voltage will drive their respective amplifiers $214_1$–$214_N$ so as to reverse bias their respective diodes $216_1$–$216_N$ and, thus, will not affect the voltage on bus 218. Note that the diode voltages of bipolar diodes $210_1$–$210_N$ are related to the die temperature in the area they are located, and the diode with the lowest voltage will correspond with the power supply unit which is the hottest.

By having inputs connected to one of diodes $210_1$–$210_N$ and the bus 218 as well as to provide the control voltage for voltage sources $208_1$–$208_N$, the amplifiers $214_1$–$214_N$ also function to measure the temperature of the diodes $210_1$–$210_N$ relative to the diode controlling the bus 218 and increase the temperature of the cooler power supply units to match that of the warmest power supply unit. To do so, the amplifier $214_1$–$214_N$ of the hottest power supply unit will provide no voltage difference between its inputs to the control input of its respective variable voltage source $208_1$–$208_N$, so its respective power MOSFET $202_{1-N}$ voltage will not cause additional current to be applied to the load 250. A difference will be applied between the noninverting and inverting terminals of amplifiers $214_1$–$214_N$ in cooler power supply units so their respective voltage sources $208_1$–$208_N$ will apply additional voltage to increase current from their respective power MOSFETS. Temperature in the cooler power supply units will, thus, increase relative to the hottest power supply unit. The die temperatures for the different power supply units will then approach the same value.

The present invention works particularly well with monolithic power control chips, because such a chip will have power MOSFET temperatures which are substantially the same temperature as the die area in which the temperature sensing diodes are located.

Although the invention has been described above with particularity, this was merely to teach one of ordinary skill in the art how to make and use the invention. Many modifications will fall within the scope of the invention, as that scope is defined by the claims which follow. For example, although the present invention is implemented using diodes $210_1$–$210_N$ which provide a voltage dependent on temperature, other elements such as resistors which provide a temperature dependent voltage may likewise be used.

What is claimed is:

1. An integrated circuit including a plurality of power supply units for driving a load terminal, each power supply unit comprising:

a power transistor having a source to drain path connecting a first power supply terminal ($V_{DD}$) to the load terminal, and having a gate;

a variable voltage source having a first voltage supply terminal coupled to the gate of the power transistor, and having a voltage control terminal;

a first diode having a p-n junction with a p terminal coupled by a current source to the first power supply terminal ($V_{DD}$) and an n terminal coupled to a second power supply terminal ($V_{SS}$);

a first amplifier having a noninverting terminal coupled to the p terminal of the first diode, an inverting terminal coupled to a bus line, and an output, wherein a voltage difference from the noninverting terminal to the inverting terminal of the first amplifier is coupled to the voltage control input of the variable voltage source; and a second diode having a p-n junction with a p terminal coupled to the inverting input of the first amplifier and an n terminal coupled to the output of the first amplifier.

2. The integrated circuit of claim 1, further comprising:

a resistor having a first terminal coupled to the bus line and a second terminal coupled to the first power supply connection ($V_{DD}$).

3. The integrated circuit of claim 1 wherein each power supply further comprises:

a second amplifier having a noninverting terminal connected to the first voltage terminal of the variable voltage source, an output coupled to the gate of the power transistor, and a noninverting input coupled to the load terminal.

4. The integrated circuit of claim 3 further comprising:

a voltage source connected between the second power supply terminal ($V_{SS}$) and a second voltage terminal of the variable voltage source.

* * * * *